United States Patent
Liu et al.

(10) Patent No.: US 9,305,942 B2
(45) Date of Patent: Apr. 5, 2016

(54) TFT ARRAY SUBSTRATE HAVING METAL OXIDE PART AND METHOD FOR MANUFACTURING THE SAME AND DISPLAY DEVICE

(71) Applicant: BOE TECHNOLOGY GROUP CO., LTD., Beijing (CN)

(72) Inventors: Xiang Liu, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 68 days.

(21) Appl. No.: 13/703,499

(22) PCT Filed: Sep. 21, 2012

(86) PCT No.: PCT/CN2012/081771
§ 371 (c)(1),
(2) Date: Dec. 11, 2012

(87) PCT Pub. No.: WO2013/044760
PCT Pub. Date: Apr. 4, 2013

(65) Prior Publication Data
US 2014/0071364 A1  Mar. 13, 2014

(30) Foreign Application Priority Data
Sep. 29, 2011 (CN) .......................... 2011 1 0294950

(51) Int. Cl.
*G02F 1/1362* (2006.01)
*H01L 27/112* (2006.01)
(Continued)

(52) U.S. Cl.
CPC ............ *H01L 27/124* (2013.01); *G02F 1/1362* (2013.01); *G02F 1/136286* (2013.01);
(Continued)

(58) Field of Classification Search
USPC ........................................... 349/43
See application file for complete search history.

(56) References Cited

U.S. PATENT DOCUMENTS 7,442,588 B2 10/2008 Jang et al.
2007/0040173 A1 2/2007 Kugimiya et al.
2010/0224873 A1* 9/2010 Sakata et al. .................... 257/43

FOREIGN PATENT DOCUMENTS

CN  1917218 A  2/2007
CN  10-1533191  * 9/2009 ............ G02F 1/1362
(Continued)

OTHER PUBLICATIONS

First Chinese Office Action dated Jan. 6, 2014; Appln. No. 201110294950.6.
(Continued)

*Primary Examiner* — Lauren Nguyen
(74) *Attorney, Agent, or Firm* — Ladas & Parry LLP

(57) ABSTRACT

Embodiments of the present invention provide a TFT array substrate and a method for manufacturing the same and a display device. The TFT array substrate comprises: a base substrate; gate lines, gate electrodes, a gate insulating layer and a semiconductor active layer formed on the base substrate; a metal barrier layer formed on the semiconductor active layer, the metal barrier layer covering the semiconductor active layer; source electrodes and drain electrodes formed on the metal barrier layer, with a metal oxide part being formed between the source electrode and the drain electrode to insulate the source electrode and the drain electrode from each other; and a protection layer formed on the gate insulating layer and the source and drain electrodes, wherein the metal oxide part is formed by oxidizing a part of the metal barrier layer located between the source electrode and the drain electrode.

7 Claims, 6 Drawing Sheets

(51) Int. Cl.
  *H01L 29/417* (2006.01)
  *H01L 21/02* (2006.01)
  *H01L 29/66* (2006.01)
  *H01L 27/12* (2006.01)
  *H01L 21/04* (2006.01)
  *H01L 21/48* (2006.01)
  *H01L 27/115* (2006.01)
  *H01L 29/45* (2006.01)
  *H01L 21/44* (2006.01)
  *H01L 27/15* (2006.01)

(52) U.S. Cl.
  CPC ............ *H01L21/44* (2013.01); *H01L 21/4885* (2013.01); *H01L 27/1259* (2013.01); *H01L 27/1288* (2013.01); *H01L 27/156* (2013.01); *H01L 29/41733* (2013.01); *H01L 29/458* (2013.01); *H01L 29/66765* (2013.01); *G02F 2001/136218* (2013.01); *G02F 2001/136236* (2013.01)

(56) References Cited

FOREIGN PATENT DOCUMENTS

| | | |
|---|---|---|
| CN | 101533191 A | 9/2009 |
| CN | 101826558 A | 9/2010 |
| CN | 102629628 A | 8/2012 |
| KR | 1020070109478 A | 10/2007 |

OTHER PUBLICATIONS

International Preliminary Report on Patentability; dated Apr. 1, 2014; PCT/CN2012/081771.

International Search Report mailed Dec. 27, 2012; PCT/CN2011/081771.

Chinese Rejection Decision dated Mar. 23, 2015: Appln. No. 201110294950.6.

Second Chinese Office Action Appln. No. 2011102949506; Issued Aug. 19, 2014.

* cited by examiner

TFT ARRAY SUBSTRATE HAVING METAL OXIDE PART AND METHOD FOR MANUFACTURING THE SAME AND DISPLAY DEVICE

TECHNICAL FIELD

Embodiments of the present invention relate to a TFT array substrate and a method for manufacturing the same and a display device.

BACKGROUND

Thin Film Transistor Liquid Crystal Displayers (TFT-LCDs) are display devices in which the rotation degree of liquid crystal molecules are changed by utilizing a change in intensity of an electric field applied to a liquid crystal layer, so that an intensity of the transmitted light is controlled to display images. Generally, a TFT-LCD display panel may include a backlight module, a polarizer, a color filter substrate, a TFT array substrate and a liquid crystal molecule layer located between the color filter substrate and the TFT array substrate.

In recent years, TFT-LCDs have been developed swiftly. For purpose of improving the display quality, TFT-LCDs use a driving circuit operated at a higher frequency, as dimensions thereof are increased constantly and resolutions thereof are enhanced constantly. In this case, TFT-LCDs have a shorter time for charging, and thus need a semiconductor material with a high mobility. In addition, delay of image signals also becomes one of key factors in restraining the display effect of TFT-LCDs having large size and high resolution, and therefore, metal material Cu with a low resistance is usually used in the TFT array substrate for forming data lines.

A process for manufacturing the TFT array substrate in the prior art may comprise: forming gate lines, gate electrodes, a gate insulating layer and a semiconductor active layer on a substrate sequentially; in order to prevent metal materials from polluting the semiconductor active layer upon forming source electrodes and drain electrodes subsequently, forming a protection layer with via holes on the semiconductor active layer; and forming the source electrodes and the drain electrodes which are connected to the semiconductor active layer through the via holes on the protection layer. In this way, the number of patterning processes is increased by one due to the formation of the protection layer, so that the production efficiency of the TFT array substrate is decreased and the production cost is increased.

SUMMARY

In an embodiment of the present invention, there is provided a thin film transistor (TFT) array substrate, comprising: a base substrate; gate lines, gate electrodes, a gate insulating layer and a semiconductor active layer formed on the base substrate; a metal barrier layer formed on the semiconductor active layer, the metal barrier layer covering the semiconductor active layer; source electrodes and drain electrodes formed on the metal barrier layer, with a metal oxide part being formed between the source electrode and the drain electrode to insulate the source electrode and the drain electrode from each other; and a protection layer formed on the gate insulating layer and the source and drain electrodes, wherein the metal oxide part is formed by oxidizing a part of the metal barrier layer located between the source electrode and the drain electrode.

In another embodiment of the invention, there is provided a display device comprising a TFT array substrate, the TFT array substrate comprising: a base substrate; gate lines, gate electrodes, a gate insulating layer and a semiconductor active layer formed on the base substrate; a metal barrier layer formed on the semiconductor active layer, the metal barrier layer covering the semiconductor active layer; source electrodes and drain electrodes formed on the metal barrier layer, with a metal oxide part being formed between the source electrode and the drain electrode to insulate the source electrode and the drain electrode from each other; and a protection layer formed on the gate insulating layer and the source and drain electrodes, wherein the metal oxide part is formed by oxidizing a part of the metal barrier layer located between the source electrode and the drain electrode.

In still another embodiment of the invention, there is provided a method for manufacturing a thin film transistor (TFT) array substrate, comprising: forming gate lines and gate electrodes on a base substrate; forming a gate insulating layer on the base substrate and the gate lines and the gate electrodes; forming an active layer on the gate insulating layer; forming a metal barrier layer on the active layer; forming a data metal layer on the metal barrier layer; performing a patterning process on the data metal layer, the metal barrier layer and the active layer by using a double-tone mask, so as to form data lines, source electrodes, drain electrodes and a semiconductor active layer and a metal barrier layer which covers the semiconductor active layer; performing an oxidization process on a part of the metal barrier layer located between the source electrode and the drain electrode, so as to form a metal oxide part for insulating the source electrode and the drain electrode from each other; and forming a protection layer on the gate insulating layer and the data lines, the source electrodes and the drain electrodes.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
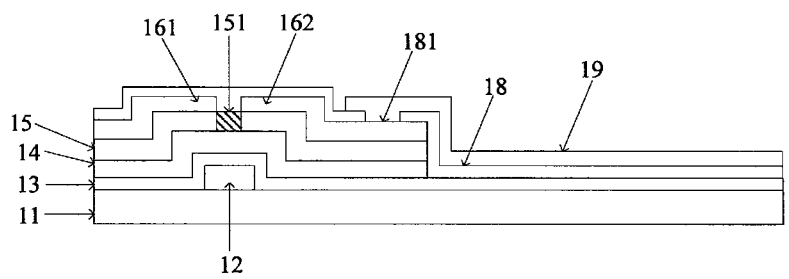
FIG. 1 is a schematic view illustrating a configuration of a TFT array substrate provided in an embodiment of the invention.

In an embodiment of the invention, there is provided a TFT array substrate, as shown in FIG. 1. The array substrate according to the embodiment of the invention comprises a plurality of gate lines and a plurality of data lines, and these gate lines and data lines intersect each other to thereby define pixel units arranged in a matrix form. Each of the pixel units comprises a thin film transistor functioning as a switch element and a pixel electrode used to control arrangement of liquid crystals. The thin film transistor of each pixel unit has a gate electrode electrically connected to or integrally formed with the corresponding gate line, a source electrode electrically connected to or integrally formed with the corresponding data line, and a drain electrode electrically connected to or integrally formed with the corresponding pixel electrode. In the following, descriptions are made mainly on single pixel unit or a plurality of pixel units, but other pixel unit(s) may be formed likewise.

For example, the TFT array substrate in the embodiment of the invention comprises: a base substrate 11; gate lines (not shown in the figure), gate electrodes 12, a gate insulating layer 13 and a semiconductor active layer 14 which are formed on the base substrate 11; a metal barrier layer 15 having a metal oxide part 151, which is formed on the semiconductor active layer 14, the metal barrier layer 15 covering the semiconductor active layer 14; source electrodes 161 and drain electrodes 162 formed on the metal barrier layer 15, wherein the metal oxide part 151 is located between the source electrode 161 and the drain electrode 162 separated from each other and can insulate the source electrode 161 and the drain electrode 162 from each other; a protection layer 18 formed on the gate insulating layer 13 and the source electrode 161 and the drain electrode 162, the protection layer 18 having via holes 181, each of which exposes the drain electrode 162; and pixel electrodes 19, each of which is formed on the protection layer 18 and is electrically connected to the drain electrode 162 through the via hole 181.

In this embodiment, for example, the metal barrier layer 15 and the semiconductor active layer 14 may have the same area. In some embodiments, the metal barrier layer 15 may also have an area larger than that of the semiconductor active layer 14. However, it is necessary to make sure that the metal barrier layer 15 can be divided into two parts by a metal oxide, so that the source electrode is avoided from being electrically connected to the drain electrode, and moreover, it should be avoided from being connected to a relevant structure of other pixel.

In this embodiment, material for the metal barrier layer 15, for example, may be titanium (Ti) or its alloy, material for the source electrode 161 and the drain electrode 162, for example, may be copper (Cu), and material for the pixel electrode 19, for example, may be Indium Tin Oxide (ITO), Indium Zinc Oxide (IZO) or other transparent conductive material.

It should be noted that, in embodiments of the invention, the metal barrier layer 15 may be formed by titanium (Ti) or its alloy, but embodiments of the invention are not limited thereto. For example, other metals may also be used to form the metal barrier layer 15, only if metal oxides can be formed by oxidization reactions thereof.

In the TFT array substrate provided in the embodiments of the invention, the metal barrier layer is formed between the source and drain electrodes and the semiconductor active layer, and the metal oxide part is formed by performing an oxidization process on a part of the metal barrier layer located between the source electrode and the drain electrode. As such, not only the semiconductor active layer can be prevented from being polluted during formation of the source electrode and the drain electrode, but also it is unnecessary to perform a patterning process on the metal barrier layer separately. Thus, as compared to prior art, the number of the patterning processes is decreased, the production efficiency is increased and the production cost is reduced.

Hereinafter, a method for manufacturing a TFT array substrate provided in an embodiment of the invention will be described with reference to FIGS. 2 to 14.

FIGS. 2 to 14 are schematic views illustrating the configuration of the substrate in each of the processes of the method for manufacturing the TFT array substrate provided in the embodiment of the invention. The method for manufacturing the TFT array substrate provided in the embodiment of the invention may include the following steps.

Step S201, gate lines and gate electrodes are formed on a base substrate.

Figure 2:
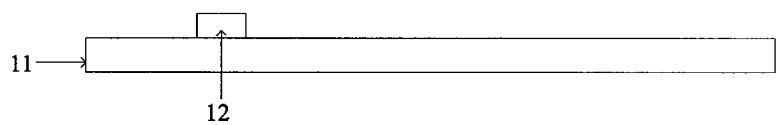
FIG. 2 is a schematic view 1 illustrating the configuration of the substrate in processes of a method for manufacturing a TFT array substrate provided in an embodiment of the invention.

In a embodiment of the invention, as shown in FIG. 2, a gate metal film, for example, which has a thickness of 4000 Å to 15000 Å, is deposited on a base substrate 11 (e.g. a glass substrate) by using a method such as sputtering or evaporation. The gate metal film may be formed by using chromium, tungsten, copper, titanium, tantalum, molybdenum or other metal, or an alloy thereof. The gate metal film may be formed by a single layer of metal, or may also be formed by a multi-layer of metals. Gate electrodes 12 and gate lines (not shown in FIG. 2) are formed by performing a patterning process on the gate metal film. The gate electrode 12 and the gate line may be electrically connected to each other or integrally formed.

In other embodiments of the invention, the base substrate 11 (e.g. the glass substrate) may also be replaced by a quartz substrate, a plastic substrate or other transparent substrate.

Step S202, a gate insulating layer is formed on the base substrate, the gate lines and the gate electrodes.

Figure 3:
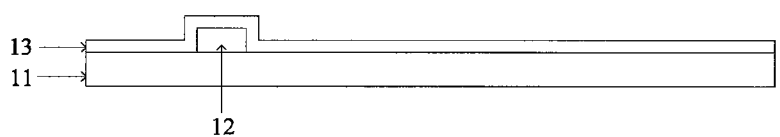
FIG. 3 is a schematic view 2 illustrating the configuration of the substrate in the processes of the method for manufacturing the TFT array substrate provided in the embodiment of the invention.

In an embodiment of the invention, as shown in FIG. 3, a gate insulating layer 13, for example, which has a thickness of 2000 Å to 5000 Å, is deposited on the base substrate 11 and the gate lines and the gate electrodes 12 by using a method such as Plasma Enhanced Chemical Vapor Deposition (PECVD). For example, the material usually used for the gate insulating layer 13 is an oxide, a nitride or an oxynitride, and corresponding reactive gases may be silicon hydride, ammonia gas and nitrogen gas, or dichlorosilane, ammonia gas and nitrogen gas.

Step S203, an active layer is formed on the gate insulating layer.

Figure 4:
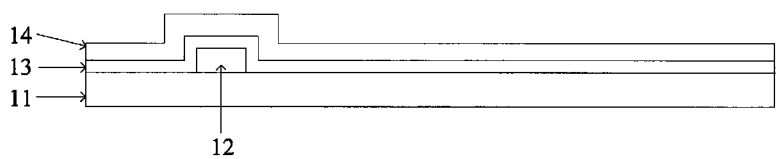
FIG. 4 is a schematic view 3 illustrating the configuration of the substrate in the processes of the method for manufacturing the TFT array substrate provided in the embodiment of the invention.

In an embodiment of the invention, as shown in FIG. 4, a metal oxide active layer 14, for example, which has a thickness of 50 Å to 1000 Å, is deposited on the gate insulating layer 13 by using a method such as sputtering. The active layer 14 will be formed to be a semiconductor active layer after it is subjected to a subsequent patterning process.

Step S204, a metal barrier layer is formed on the active layer.

Figure 5:
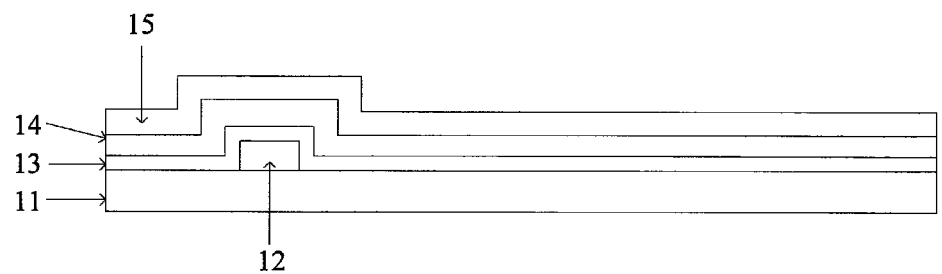
FIG. 5 is a schematic view 4 illustrating the configuration of the substrate in the processes of the method for manufacturing the TFT array substrate provided in the embodiment of the invention.

In an embodiment of the invention, as shown in FIG. 5, a metal barrier layer 15, for example, which has a thickness of 50 Å to 500 Å, is deposited on the active layer 14 by using a method such as sputtering. As an example, the metal barrier layer 15 may be formed by titanium (Ti) or its alloy.

Step S205, a data metal layer is formed on the metal barrier layer.

Figure 6:
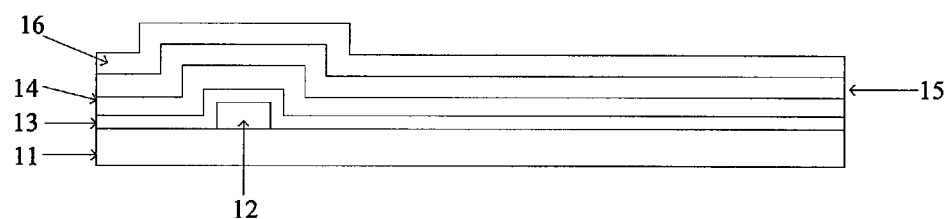
FIG. 6 is a schematic view 5 illustrating the configuration of the substrate in the processes of the method for manufacturing the TFT array substrate provided in the embodiment of the invention.

In an embodiment of the invention, as shown in FIG. 6, a data metal layer 16, for example, which has a thickness of 1000 Å to 5000 Å, is deposited on the metal barrier layer 15 by using a method such as sputtering. As an example, the data metal layer 16 may be formed by copper (Cu).

Step S206, a photoresist layer is formed on the data metal layer.

Figure 7:
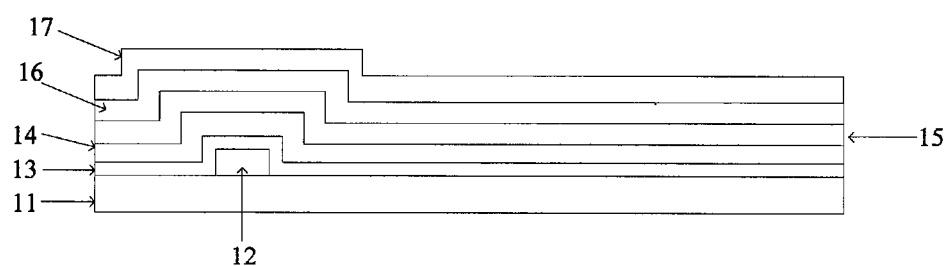
FIG. 7 is a schematic view 6 illustrating the configuration of the substrate in the processes of the method for manufacturing the TFT array substrate provided in the embodiment of the invention.

In an embodiment of the invention, as shown in FIG. 7, a photoresist layer 17 is formed on the data metal layer 16 by using a method such as spin-coating. In this embodiment, the photoresist layer 17 is formed by using a positive photoresist, but embodiments of the invention are not limited thereto.

Step S207, a photolithography process is performed on the photoresist layer by using a double-tone mask, so as to form a first photoresist pattern.

Figure 8:
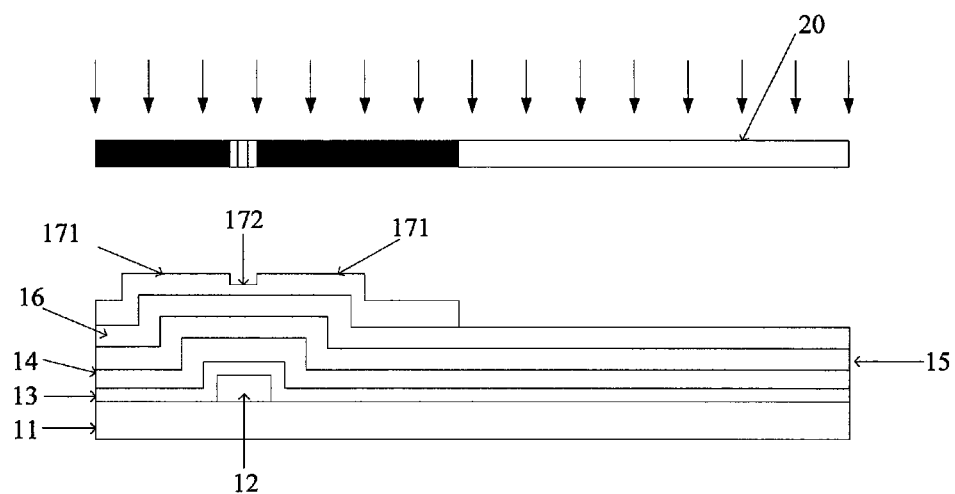
FIG. 8 is a schematic view 7 illustrating the configuration of the substrate in the processes of the method for manufacturing the TFT array substrate provided in the embodiment of the invention.

In an embodiment of the invention, as shown in FIG. 8, the photoresist layer 17 is exposed by using a double-tone mask (for example, including a gray-tone mask or a semi-transmitting type mask), and the exposed photoresist layer 17 is developed, so as to form a first photoresist pattern. In this way, after performing the development, a photoresist-fully-retained region 171, a photoresist-half-retained region 172 and a photoresist-fully-removed region are formed on the base substrate. In the pixel unit, the photoresist-fully-retained region 171 corresponds to a region where the data line, the source electrode and the drain electrode are located, and the photoresist-half-retained region 172 corresponds to a region between the source electrode and the drain electrode. In a subsequent etching step, the first photoresist pattern (including the photoresist located in the photoresist-fully-retained region 171 and the photoresist-half-retained region 172) will be used as an etching mask.

Step S208, the data metal layer, the metal barrier layer and the active layer are etched by using the first photoresist pattern as a mask.

Figure 9:
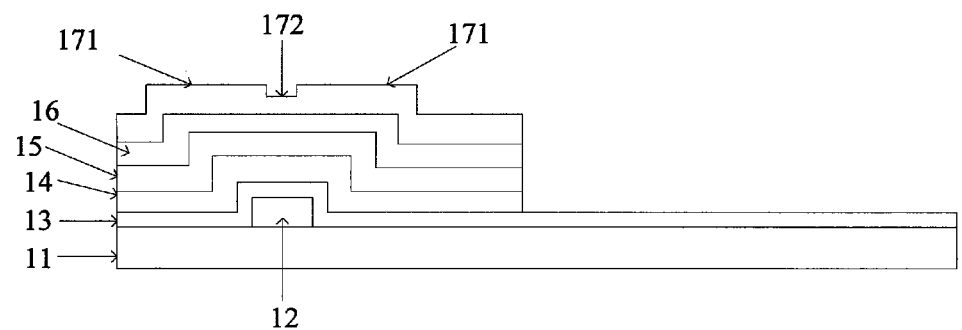
FIG. 9 is a schematic view 8 illustrating the configuration of the substrate in the processes of the method for manufacturing the TFT array substrate provided in the embodiment of the invention.

In an embodiment of the invention, as shown in FIG. 9, by using the first photoresist pattern (including the photoresist located in the photoresist-fully-retained region 171 and the photoresist-half-retained region 172) as a mask, the data metal layer 16, the metal barrier layer 15 and the active layer 14 in the photoresist-fully-removed region are removed through an etching process. In some embodiments of the invention, a dry etching such as a reactive ion etching (RIE) may be used for the etching process. In other embodiments of the invention, the etching process may also be conducted by using a wet etching.

Step S209, the photoresist located in the photoresist-half-retained region is removed, so as to form a second photoresist pattern.

Figure 10:
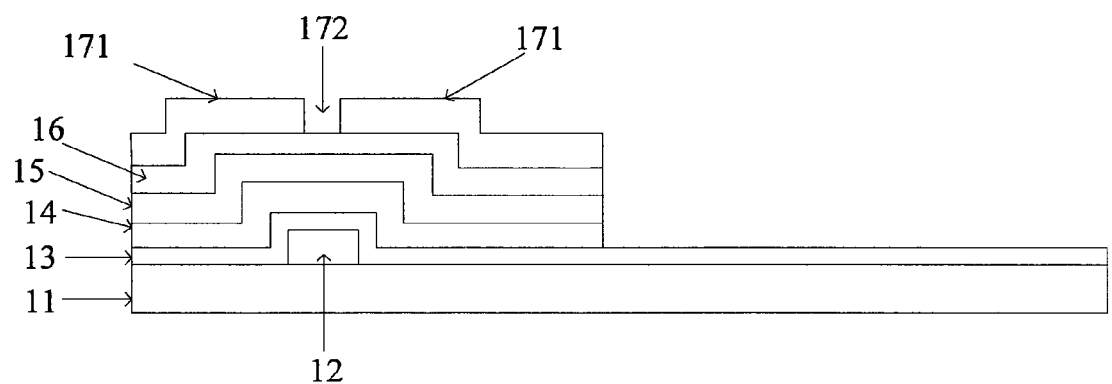
FIG. 10 is a schematic view 9 illustrating the configuration of the substrate in the processes of the method for manufacturing the TFT array substrate provided in the embodiment of the invention.

In an embodiment of the invention, as shown in FIG. 10, the photoresist located in the photoresist-half-retained region 172 is removed by utilizing, for example, a plasma ashing process, so as to form a second photoresist pattern (only including the photoresist located in the photoresist fully-retained region 171). During performance of the plasma ashing process, the photoresist located in the photoresist-fully-retained region 171 is also be partially removed in a thickness direction and a part of the photoresist layer with a reduced thickness is left (namely, the second photoresist pattern) while the photoresist located in the photoresist half-retained region 172 is fully removed.

Step S210, the data metal layer is etched by using the second photoresist pattern as a mask.

Figure 11:
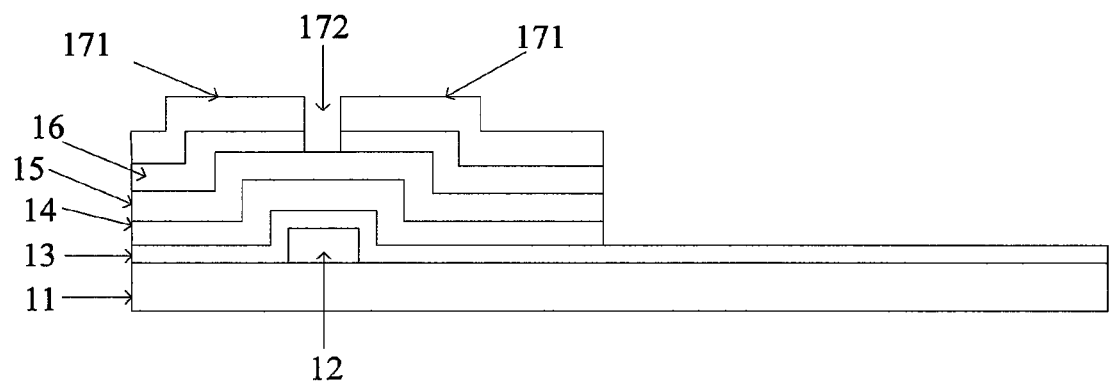
FIG. 11 is a schematic view 10 illustrating the configuration of the substrate in the processes of the method for manufacturing the TFT array substrate provided in the embodiment of the invention.

In an embodiment of the invention, as shown in FIG. 11, by using the second photoresist pattern (namely, the photoresist located in the photoresist-fully-retained region 171) as a mask, the data metal layer 16 in the photoresist-half-retained region 171 is removed through an etching process.

Step S211, an oxidization process is performed on a part of the metal barrier layer located between the source electrode and the drain electrode, so as to form a metal oxide part.

Figure 12:
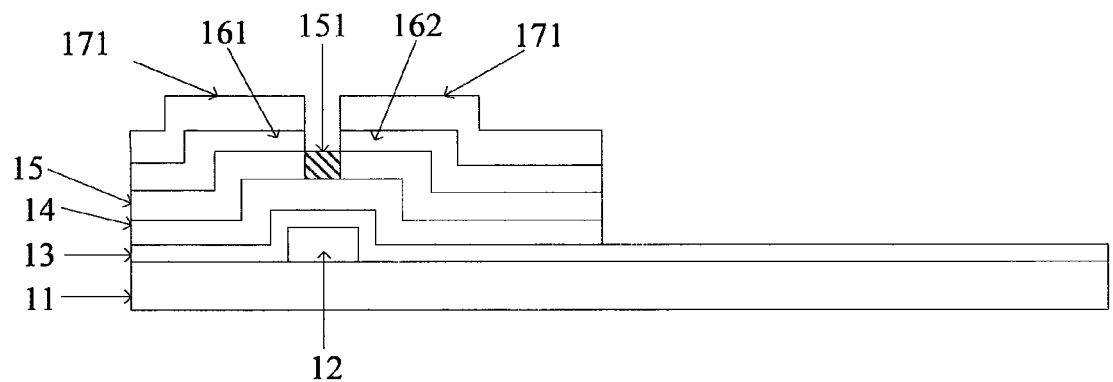
FIG. 12 is a schematic view 11 illustrating the configuration of the substrate in the processes of the method for manufacturing the TFT array substrate provided in the embodiment of the invention.

In an embodiment of the invention, as shown in FIG. 12, an oxidization process is performed on a part of the metal barrier layer 15 located between the source electrode 161 and the drain electrode 162 by a process such as ion implantation or oxygen plasma treatment. Through the above oxidization process, metal in the part of the metal barrier layer 15 located between the source electrode 161 and the drain electrode 162 is changed into a metal oxide, so as to form a metal oxide part 151 for insulating the source electrode 161 and the drain electrode 162 from each other.

In the above embodiments of the invention, as an example, titanium (Ti) is used as material for the metal barrier layer 15, but embodiments of the invention are not limited thereto. For example, other metals may also be used to form the metal barrier layer 15, only if metal oxides can be formed by oxidization reactions thereof.

Step S212, the second photoresist pattern is removed.

Figure 13:
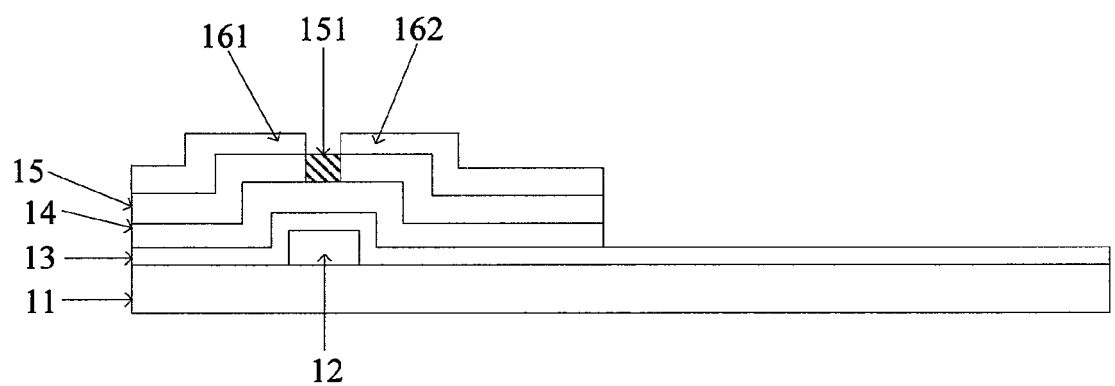
FIG. 13 is a schematic view 12 illustrating the configuration of the substrate in the processes of the method for manufacturing the TFT array substrate provided in the embodiment of the invention.

In an embodiment of the invention, as shown in FIG. 13, the second photoresist pattern (namely, the photoresist located in the photoresist-fully-retained region 171) is removed through a process such as a stripping-off process. Accordingly, data lines (not shown in the figure), the source electrode 161, the drain electrode 162 and a semiconductor active layer 14, and the metal barrier layer 15 which covers the semiconductor active layer 14 are obtained. The drain electrode 162 and the data line may be electrically connected to each other or integrally formed. In this embodiment, the metal barrier layer 15 and the semiconductor active layer 14 can have the same area, for example. In some embodiments, the metal barrier layer 15 may also have an area larger than that of the semiconductor active layer 14. However, it is necessary to make sure that the metal barrier layer 15 can be divided into two parts by the metal oxide, so that the source electrode is avoided from being electrically connected to the drain electrode; and moreover, it should be avoided from being connected to a relevant structure of other pixel.

It should be noted that, in this embodiment, a semiconductor material coated on the whole base substrate is called as the active layer, and an active layer pattern which is obtained after it is subjected to a patterning process (namely, an active layer in a TFT region) is called as the semiconductor active layer. The active layer and the semiconductor active layer are made by the same material.

Step S213, a protection layer is formed on the gate insulating layer and the source and drain electrodes, and the protection layer has via holes, each of which exposes the drain electrode.

Figure 14:
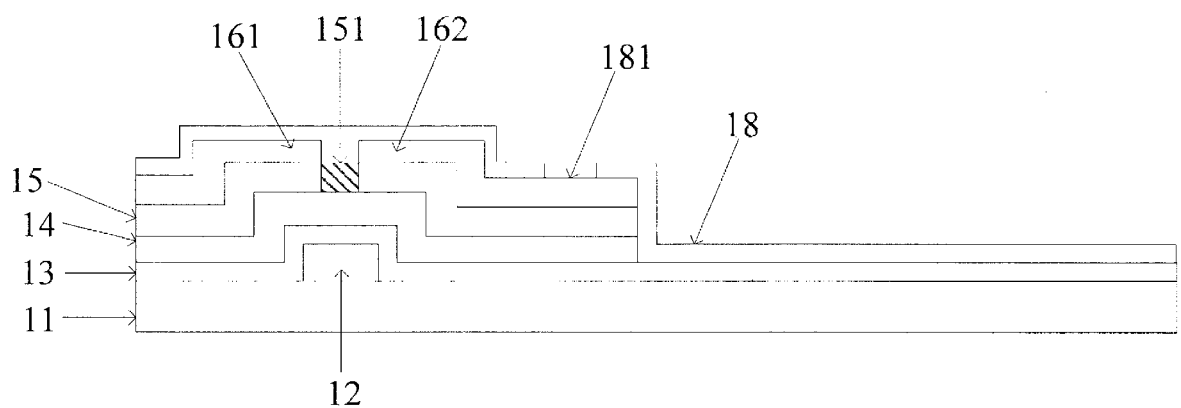
FIG. 14 is a schematic view 13 illustrating the configuration of the substrate in the processes of the method for manufacturing the TFT array substrate provided in the embodiment of the invention.

In an embodiment of the invention, as shown in FIG. 14, a protection layer 18 is formed on the gate insulating layer 13 and the source electrode 161 and the drain electrode 162 by a process such as sputtering or PECVD, and via holes 181, each of which exposes the drain electrode 162, are formed on the protection layer 18 through a patterning process. As an example, the protection layer 18 may be an oxide layer, a nitride layer or an oxynitride layer.

Step S214, pixel electrodes electrically connected to the drain electrodes are formed on the protection layer.

In an embodiment of the invention, pixel electrodes 19 are formed by depositing a transparent conductive layer on the protection layer 18 through a process such as sputtering, and then performing a patterning process on the transparent conductive layer, and the pixel electrodes 19 are electrically connected to the drain electrodes 162 through the via holes 181. As an example, the transparent conductive layer may be Indium Tin Oxide (ITO), Indium Zinc Oxide (IZO) or other transparent conductive material.

In the method for manufacturing the TFT array substrate provided in the embodiments of the invention, the metal barrier layer is formed between the source and drain electrodes and the semiconductor active layer, and the metal oxide part for insulating the source electrode and the drain electrode from each other is formed by performing an oxidization process on a part of the metal barrier layer between the source electrode and the drain electrode. As such, not only the semiconductor active layer can be prevented from being polluted during the formation of the source electrode and the drain electrode, but also it is unnecessary to perform a patterning process on the metal barrier layer separately. Thus, as compared to prior art, the number of the patterning processes is decreased, the production efficiency is increased, and the production cost is reduced.

According to an embodiment of the invention, there is further provided a display device, comprising a TFT array substrate in any of the above embodiments.

An example of the display device is a liquid crystal display device, in which the TFT array substrate and an opposed substrate are disposed opposite to each other so as to form a liquid crystal cell, and a liquid crystal material is filled in the liquid crystal cell. The opposed substrate is, for example, a color filter substrate. A pixel electrode in each pixel unit of the TFT array substrate acts to apply an electric field for controlling the rotation degree of the liquid crystal material, so as to conduct a display operation. In some examples, the liquid crystal display device further comprises a backlight source used to provide backlight for the array substrate.

Another example of the display device is an organic electroluminescent display device, in which a pixel electrode in each pixel unit of the TFT array substrate functions as an anode or a cathode for driving an organic light emitting material to emit light, so as to conduct a display operation.

The forgoing embodiments are merely used to explain the technical solutions of the invention, but not limitations on them. Although the invention is described in detail with reference to the above embodiments, as would be appreciated by those ordinarily skilled in the art, they can make modifications to the technical solutions recorded by the above embodiments or make equivalent replacements to a part of technical features therein; and these modifications or replacements do not make the essence of a corresponding technical solution departing from the spirit and scope of the present disclosure.

The invention claimed is:

1. A method for manufacturing a thin film transistor (TFT) array substrate, comprising:
    forming gate lines and gate electrodes on a base substrate;
    forming a gate insulating layer on the base substrate and the gate lines and the gate electrodes;
    forming an active layer on the gate insulating layer;
    forming a metal barrier film on the active layer;
    forming a data metal layer on the metal barrier film;
    performing a patterning process on the data metal layer, the metal barrier film and the active layer by using a double-tone mask, so as to form data lines, source electrodes, drain electrodes and a semiconductor active layer and a metal barrier layer which covers the semiconductor active layer, wherein the metal barrier layer comprises an unetched and exposed part which corresponds to a gap being formed between the source electrode, and the drain electrode; the data lines, the source electrodes, the drain electrodes, the semiconductor active layer and the metal barrier layer possess a same mask;
    performing an oxidization process on the unetched and exposed part of the metal barrier layer, so as to form a metal oxide part for insulating the source electrode and the drain electrode from each other; and
    forming a protection layer on the gate insulating layer and the data lines, the source electrodes and the drain electrodes;
    wherein performing of the patterning process on the data metal layer, the metal barrier film and the active layer by using the double-tone mask so as to form the data lines, the source electrodes, the drain electrodes and the semiconductor active layer and the metal barrier layer covering the semiconductor active layer and performing of the oxidization process on the unetched and exposed part of the metal barrier layer so as to form the metal oxide part for insulating the source electrode and the drain electrode from each other comprises:
    forming a photoresist layer on the data metal layer;
    performing a photolithography process on the photoresist layer by using the double-tone mask to form a photoresist-fully-retained region, a photoresist-half-retained region and a photoresist-fully-removed region, the photoresist-fully-retained region corresponding to a region where the data lines, the source electrodes and the drain electrodes are located, and the photoresist-half-retained region corresponding to a region between the source electrode and the drain electrode, and the photoresist located in the photoresist-fully-retained region and the photoresist-half-retained region forming a first photoresist pattern;

removing the data metal layer, the metal barrier film and the active layer in the photoresist-fully-removed region through an etching process by using the first photoresist pattern as a mask;

removing the photoresist in the photoresist-half-retained region by utilizing a plasma ashing process, so as to form a second photoresist pattern;

removing the data metal layer in the photoresist half-retained region through an etching process by using the second photoresist pattern as a mask; and performing an oxidization process on the part of the metal barrier layer located between the source electrode and the drain electrode, so as to form the metal oxide part for insulating the source electrode and the drain electrode from each other, wherein none of the metal barrier film and the active layer in the photoresist-half-retained region is etched away.

2. The method for manufacturing the thin film transistor array substrate according to claim 1, further comprising: forming pixel electrodes electrically connected to the drain electrodes on the protection layer.

3. The method for manufacturing the thin film transistor array substrate according to claim 1, wherein the double-tone mask is a gray-tone mask or a semi-transmitting mask.

4. The method for manufacturing the thin film transistor array substrate according to claim 2, wherein the protection layer is formed with via holes, each of which exposes the drain electrode, and the pixel electrodes is electrically connected to the drain electrode through the via hole.

5. The method for manufacturing the thin film transistor array substrate according to claim 4, further comprising: after formation of the metal oxide part, removing the second photoresist pattern.

6. The method for manufacturing the thin film transistor array substrate according to claim 1, wherein material for the data metal layer includes copper.

7. The method for manufacturing the thin film transistor array substrate according to claim 1, wherein material for the metal barrier layer is titanium or its alloy.

* * * * *